United States Patent
Hao et al.

(10) Patent No.: US 6,363,882 B1
(45) Date of Patent: Apr. 2, 2002

(54) LOWER ELECTRODE DESIGN FOR HIGHER UNIFORMITY

(75) Inventors: Fangli Hao, Cupertino; Albert R. Ellingboe, Fremont; Eric H. Lenz, Pleasanton, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/475,824

(22) Filed: Dec. 30, 1999

(51) Int. Cl.[7] ............................................. C23C 16/00
(52) U.S. Cl. ................................. 118/723 E; 156/345
(58) Field of Search ................... 118/723 E, 723 I, 118/723 AN, 723 MW, 728, 723 ER, 723 IR, 723 MA, 723 MR, 723 ME; 156/345

(56) References Cited

U.S. PATENT DOCUMENTS

| | | | |
|---|---|---|---|
| 4,133,738 A | 1/1979 | Will | |
| 5,286,297 A | 2/1994 | Moslehi et al. | |
| 5,529,657 A | 6/1996 | Ishii | |
| 5,665,167 A | * 9/1997 | Deguchi et al. | 118/728 |
| 5,716,485 A | 2/1998 | Salimian et al. | |
| 5,919,332 A | * 7/1999 | Koshiishi et al. | 156/345 |
| 5,942,039 A | * 8/1999 | Kholodenko et al. | 118/723 E |
| 6,042,686 A | 3/2000 | Dible et al. | |
| 6,074,518 A | * 6/2000 | Imafuku et al. | 156/345 |
| 6,129,808 A | * 10/2000 | Wicker et al. | 156/345 |

FOREIGN PATENT DOCUMENTS

| | | |
|---|---|---|
| EP | 0887853 | 12/1998 |
| EP | 0969123 | 1/2000 |
| WO | 98/39500 | 9/1998 |
| WO | 99/14788 | 3/1999 |

* cited by examiner

Primary Examiner—Gregory Mills
Assistant Examiner—Luz Alejandro
(74) Attorney, Agent, or Firm—Beyer Weaver & Thomas, LLP

(57) ABSTRACT

A plasma processing system for processing a substrate is disclosed. The plasma processing system includes a process chamber within which a plasma is both ignited and sustained for processing. The plasma processing system further includes an electrode disposed at the lower end of the process chamber. The electrode is configured for generating an electric field inside the process chamber. The plasma processing system also includes a component for controlling an impedance between the electrode and the plasma. The impedance is arranged to affect the electric field to improve processing uniformity across the surface of the substrate.

28 Claims, 4 Drawing Sheets

LOWER ELECTRODE DESIGN FOR HIGHER UNIFORMITY

BACKGROUND OF THE INVENTION

The present invention relates to apparatus and methods for processing substrates such as semiconductor substrates for use in IC fabrication or panels (e.g., glass, plastic, or the like) for use in flat panel display applications. More particularly, the present invention relates to methods and apparatuses that are capable of processing substrates with a high degree of processing uniformity across the substrate surface.

Over the years, plasma processing systems utilizing inductively coupled plasma sources, electron cyclotron resonance (ECR) sources, capacitive sources, and the like, have been introduced and employed to various degrees to process semiconductor substrates and display panels. During the manufacture of these products, multiple deposition and/or etching steps may be employed. During deposition, materials are deposited onto a substrate surface (such as the surface of a glass panel or a wafer). For example, deposited layers such as various forms of silicon, silicon dioxide, silicon nitride, metals and the like may be formed on the surface of the substrate. During etching, materials are selectively removed from predefined areas on the substrate surface. For example, etched features such as vias, contacts, or trenches may be formed in the layers of the substrate.

Referring to FIG. 1, a conventional plasma processing system 10 is shown. In order to process a substrate, a substrate 12 is placed on a substrate pedestal 14 inside a process chamber 16 and a process gas is fed into the process chamber 16. Also, energy is supplied to the process gas to ignite a plasma 18 inside the process chamber 16. After the plasma is ignited, it is sustained with additional energy, which may be coupled to the plasma in various well-known ways, e.g., capacitively, inductively, through microwave, and the like. The plasma is then employed in the processing task, e.g., to selectively etch or deposit a film on the substrate 12. In most situations, a sheath voltage 20 is formed proximate the substrate surface to accelerate the ions of the plasma towards the substrate 12 where they, possibly in combination with other reactants, activate the processing reaction. The sheath voltage is associated with an electrical potential produced between the substrate pedestal 14 and the plasma 18.

Unfortunately, however, the electrical coupling between the substrate pedestal 14 and the plasma 18 tends to be non-uniform, which as a result causes variations in the process performance across the surface of the substrate 12. In particular, the center of the substrate tends to be processed differently than the edge of the substrate, and therefore the yield between the center and edge differ. Accordingly, the edge of the substrate is not generally used to create IC's, which as a result translates into higher costs for the manufacturer. Furthermore, the demand for larger substrates has made it increasingly important to improve process uniformity at the edge of the substrate.

In view of the foregoing, there are desired improved methods and apparatuses for increasing process uniformity at the surface of the substrate.

SUMMARY OF THE INVENTION

The invention relates, in one embodiment, to a plasma processing system for processing a substrate. The plasma processing system includes a process chamber within which a plasma is both ignited and sustained for processing. The process chamber has an upper end and a lower end. The plasma processing system further includes an electrode disposed at the lower end of the process chamber. The electrode is configured for generating an electric field inside the process chamber. The plasma processing system also includes a component for controlling an impedance between said electrode and said plasma, said impedance being arranged to affect said electric field to improve processing uniformity across the surface of said substrate.

The invention relates, in another embodiment, to a plasma processing system for processing a substrate. The plasma processing system includes a process chamber within which a plasma is both ignited and sustained for processing. The plasma processing system further includes an electrode disposed inside the process chamber. The electrode is configured for generating an electric field between the plasma and the electrode. The plasma processing system additionally includes a chuck disposed above the electrode. The chuck is configured for holding the substrate during processing. The electrical field has a first impedance between the electrode and the plasma in the region of the chuck. The plasma processing system further includes an edge ring disposed above the electrode and adjacent to the chuck. The edge ring is configured for shielding at least the electrode from the plasma. The plasma processing system also includes an impedance matching layer disposed between the edge ring and the electrode. The impedance matching layer is configured for controlling a second impedance between the electrode and the plasma in the region of the edge ring. The second impedance is arranged to be substantially equal to the first impedance such that the electrical field between the plasma and the electrode at the surface of the substrate is substantially uniform when the substrate is disposed on the chuck for processing.

The invention relates, in another embodiment, to a substrate pedestal for processing a substrate with a plasma. The substrate pedestal includes an electrode for generating an electric field above the substrate. The electrode has an outer periphery that is larger than an outer periphery of the substrate. The substrate pedestal further includes a chuck for holding the substrate during processing. The chuck is disposed on a top surface of the electrode. The substrate pedestal additionally includes an edge ring for shielding the electrode and the chuck from the plasma. The edge ring is disposed above the electrode. The edge ring has a first portion and a second portion. The first portion is configured to surround the edge of the substrate when the substrate is held by the chuck for processing. The second portion is configured to surround the edge of the chuck, wherein the second portion is disposed between the electrode and the substrate during processing. The substrate pedestal also includes an impedance matching layer disposed between the edge ring and the electrode. The impedance matching layer is configured to control an impedance of the electric field through the chuck, the edge ring and the substrate. The impedance is arranged to affect the electric field to improve processing uniformity across the surface of the substrate.

DETAILED DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

In processing substrates, one of the most important parameters that process engineers strive to improve is process uniformity. As the term is employed herein, process uniformity refers to the uniformity of the entire process across the surface of the substrate. If the process is highly uniform, for example, it is expected that the process rates at different points on the substrate tend to be substantially equal. In this case, it is less likely that one area of the substrate will be unduly over-processed while other areas remain inadequately processed.

The invention therefore pertains to improved methods and apparatuses for processing substrates. More particularly, the invention pertains to a substrate pedestal that is capable of producing a high degree of processing uniformity across the surface of a substrate. The pedestal is configured to reduce the electrical and thermal discontinuities typically found near the substrate edge. By reducing these discontinuities, process variations found between the center and edge of the substrate are substantially reduced. As a result, more of the substrate can be used for creating IC's, and therefore device yield is increased.

Embodiments of the invention are discussed below with reference to FIGS. 2–4. However, those skilled in the art will readily appreciate that the detailed description given herein with respect to these figures is for explanatory purposes as the invention extends beyond these limited embodiments.

In a preferred embodiment, the present invention is practiced in a plasma reactor, such as the capacitively coupled plasma reactor, which is available from Lam Research Corporation of Fremont, Calif. Although a capacitively coupled plasma reactor will be shown and described, it should be noted that the present invention may be practiced in any plasma reactor that is suitable for forming a plasma, such as an inductively coupled or an ECR reactor.

Figure 1:
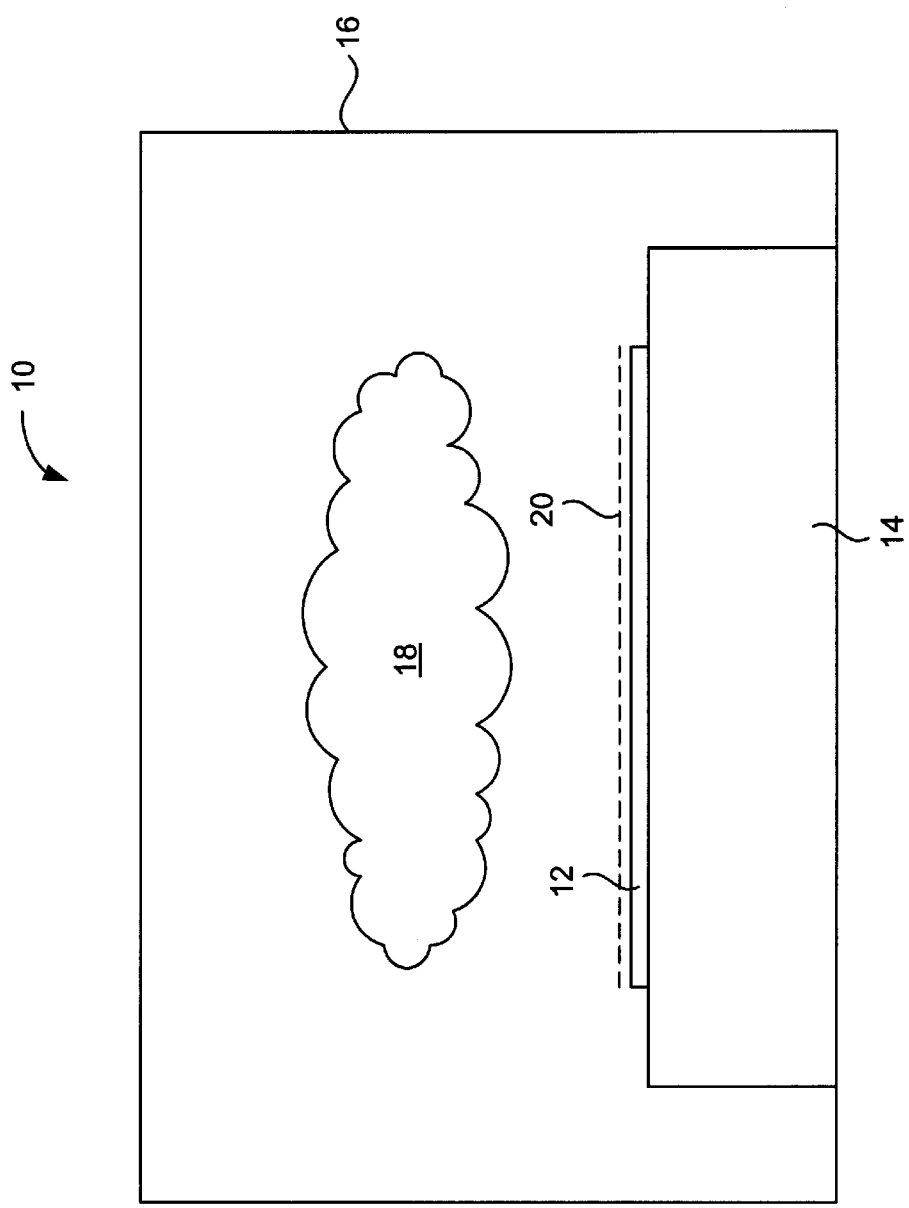
FIG. 1 is a side elevation view of a conventional plasma processing system.
Figure 2:
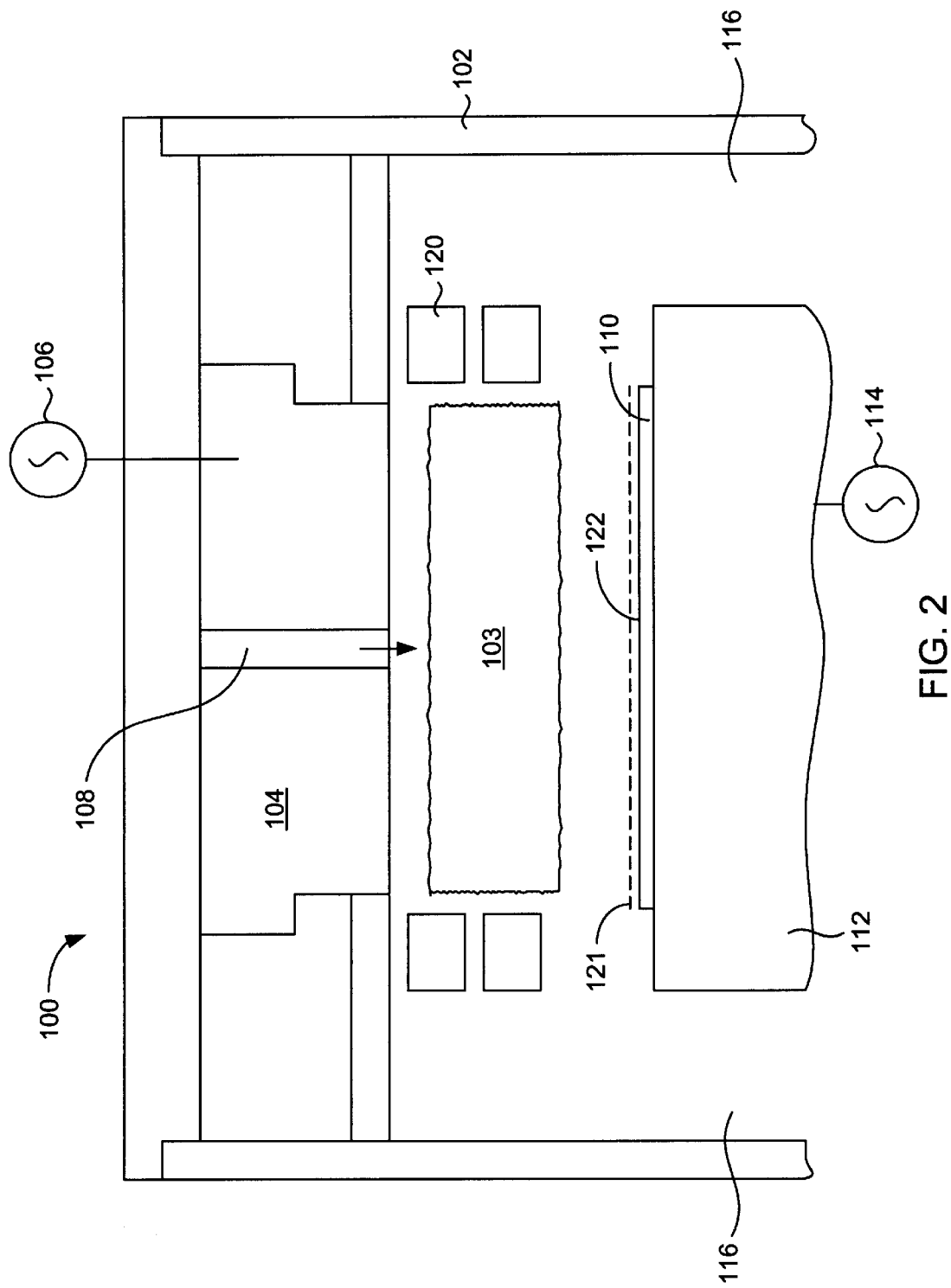
FIG. 2 is a side elevation view, in cross section, of a plasma reactor, in accordance with one embodiment of the present invention.

FIG. 2 illustrates a plasma reactor 100, in accordance with one embodiment of the present invention. The plasma reactor 100 generally includes a process chamber 102 within which a plasma 103 is both ignited and sustained for processing. Inside the chamber 102, there is generally disposed an upper electrode 104, which may be coupled to a first RF power supply 106 via a matching network (not shown to simplify the illustration). First RF power supply 106 is generally configured to supply upper electrode 104 with RF energy. A gas inlet 108 is provided within the upper electrode 104 for releasing gaseous source materials, e.g., the etchant source gases, into the active region between the upper electrode 104 and a substrate 110. The gaseous source materials may also be released from ports built into the walls of the chamber itself.

Substrate 110 is introduced into chamber 102 and disposed on a pedestal 112, which acts as a chuck and a lower electrode. The pedestal 112 is preferably biased by a second RF power supply 114 (also typically via a matching network) that is generally configured to supply pedestal 112 with RF energy. The chuck portion of pedestal 112 may represent, for example, an ESC (electrostatic) chuck, which secures substrate 110 to the chuck's surface by electrostatic force. However, it should be understood that a mechanical type chuck may also be used. Pedestal 112 will be described in greater detail below. Additionally, substrate 110 represents the work-piece to be processed, which may represent, for example, a semiconductor substrate to be etched, deposited, or otherwise processed or a glass panel to be processed into a flat panel display. Also, an exhaust port 116 for exhausting by-product gases formed during processing is generally disposed between the chamber walls of the process chamber 102 and the chuck 112. In most embodiments, the exhaust port 116 is coupled to a pump for maintaining the appropriate pressures inside process chamber 102. In addition, a confinement ring 120 may be disposed inside process chamber 102 between the upper electrode 104 and the pedestal 112 to confine the plasma 103 above the substrate 110.

While the pedestal 112 is shown and described as being coupled to RF power supply 114, it will be appreciated that other configurations may be used to accommodate different process chambers or to conform to other external factors necessary to allow the coupling of energy. For example, in some single frequency plasma reactors the pedestal may be coupled to ground.

In order to create plasma 103, a process gas is typically input into process chamber 102 through gas inlet 108. Subsequently, when one or both of the RF power supplies are energized a large electric field is coupled inside the process chamber through one or both of the electrodes 104, 112. The electric field excites the small number of electrons present inside the chamber 102 causing them to collide with the gas molecules of the process gas. As a result, the gas molecules lose electrons and leave behind positively charged ions. As soon as the creation rate of free electrons exceeds their loss rate, the plasma ignites. The plasma 103 is then employed in the processing task, e.g., to selectively etch or deposit a film on the substrate 110. In most situations, a sheath voltage 121 is formed proximate the substrate surface 122 to accelerate the ions of the plasma 103 towards the substrate 110 where they, possibly in combination with other reactants, activate the processing reaction.

It should be noted that although the plasma reactor 100 is described in detail, the invention itself is not limited to any particular type of substrate processing apparatus and may be adapted for use in any of the known substrate processing systems, including but not limited to those adapted for deposition processes, including chemical vapor deposition (CVD), plasma enhanced chemical vapor deposition (PECVD), and physical vapor deposition (PVD), such as sputtering. Furthermore, the present invention may be used in any of a number of suitable and known etching processes, including those adapted for dry etching, plasma etching, reactive ion etching (RIE), magnetically enhanced reactive ion etching (MERIE), electron cyclotron resonance (ECR), or the like. Further still, it is contemplated that the invention may be practiced in any of the above reactors, as well as other suitable plasma processing reactors. Note that the above is true irrespective of whether energy to the plasma is delivered through direct current plasma sources, through capacitively coupled parallel electrode plates, through ECR microwave plasma sources, or through inductively coupled RF sources such as helicon, helical resonators, and RF antenna (planar or non planar).

In accordance with one aspect of the present invention, a uniformity pedestal is provided that is capable of producing a high degree of processing uniformity across the surface of a substrate. In particular, the uniformity pedestal is configured to produce a uniform electric field. FIG. 3 illustrates a uniformity pedestal 130, according to one embodiment of the present invention. The uniformity pedestal 130 may respectively correspond to the pedestal 112 illustrated in FIG. 2.

The uniformity pedestal 130 generally includes an electrode 152, a chuck 154, an edge ring 156 and an impedance matching layer 158. The electrode 152 is configured for generating an electric field that is sufficiently strong to couple energy through the chuck 154, the edge ring 156, the impedance matching layer 158 and a substrate 160. By way of example, the energy generated by the electrode 152 may be arranged to form a sheath voltage between the surface of the substrate and a plasma, which is used to accelerate the ions in the plasma towards the substrate. The amount of energy that is coupled generally effects the density and energy of the plasma used to process the substrate. For example, if the coupled energy is large the ion energy tends to be high and if the coupled energy is small the ion energy tends to be low. Correspondingly, a high ion energy tends to be more aggressive during substrate processing and a low ion energy tends to be less aggressive during substrate processing.

Furthermore, the top surface of the electrode 152 is configured to be substantially uniform and substantially parallel to the substrate 160 to provide an even distribution of energy. Additionally, the electrode 152 is generally formed from a suitable conductive material such as aluminum. The outer periphery of the electrode 152 is also configured to extend beyond at least the outer edge of the substrate 160. However, it should be noted that care is generally taken to not have the electric field extend out to far past the edge of the substrate 160 due to the amount of power lost in that area. In one embodiment, the electrode 152 is configured to couple energy 2 mm beyond the edge of the substrate 160. One particular advantage of extending the electrode past the substrate edge is that the electrical characteristics at the edge of the substrate tend to be more uniform. That is, the coupling of energy tends to be more uniform near the edge of the substrate, and as a result, processing tends to be more uniform across the surface of the substrate.

The chuck 154 is coupled to the upper surface of the electrode 152 and includes a ceramic layer (e.g., $Al_3O_2$) that is configured for receiving the backside of the substrate 160 when the substrate 160 is placed on the uniformity pedestal 130 for processing. Generally, the chuck 154 is substantially parallel to the substrate 160. Chuck 154 may represent, for example, an ESC (electrostatic) chuck, which secures substrate 160 to the chuck's surface by electrostatic force. An example of an ESC chuck configuration that may be used in the uniformity pedestal 130 is described in greater detail in U.S. Pat. No. 5,793,192 to Kubly et al., which is incorporated herein by reference in its entirety. In most embodiments, the outer periphery of the chuck 154 is smaller than the outer periphery of the substrate 160 such that the chuck 154 is fully covered by the substrate 160 when the substrate 160 is disposed on the uniformity pedestal 130 for processing. In one particular implementation, the outer edge of the chuck 154 ends at a point that is about 2 mm from the outer edge of the substrate 160. Alternatively, the outer periphery of the chuck 154 may be configured to extend past the outer periphery of the substrate 160.

In some plasma reactors (e.g., high powered reactors) the surfaces next to the substrate 160 may be destroyed due to wear from the plasma, i.e., ion bombardment, and thus, an edge ring 156 is disposed above the electrode and is arranged for shielding the electrode 152 and the chuck 154 from the plasma 103. In most embodiments, the edge ring 156 is configured to be a consumable part that is replaced after excessive wear. In order to effectively shield the electrode 152 and the chuck 154, the edge ring 156 typically has a first portion 162 that surrounds the outer edge of the substrate 160 and a second portion 164 that surrounds the outer edge of the chuck 154. The second portion 164 is typically adjacent to the outer edge of the chuck 154 and disposed between the electrode 152 and the substrate 160. As shown, the second portion 164 is covered by the substrate 160 when the substrate 160 is disposed on the uniformity chuck 130 for processing. In one implementation, the second portion of the edge ring extends about 2 mm under the substrate.

Further, the outer edge of the edge ring 156 is configured to extend to at least the outer edge of the electrode 152. In general, however, it is preferable to keep the length (measured across the bottom surface) of the edge ring 156 small to reduce the power needed to process the substrate 160. By way of example, a length between 2 to about 15 mm works well. Similar to the extended electrode, the edge ring advantageously provides a coupled region that extends beyond the edge of the substrate and therefore the electrical characteristics across the substrate tend to be more uniform. Further still, a top surface of the edge ring 156 (e.g., first portion 162) is arranged to be slightly below or about the same level as the top surface of the substrate such that the chuck and the edge ring cooperate to form a recessed portion for accepting the substrate for processing. However, it should be noted that the level of the top surface of the edge ring may vary according to the specific design of each plasma processing system (e.g., may extend above the substrate or may be sloped).

Moreover, the edge ring 156 may be electrically floating or be electrically coupled to a DC ground (i.e., need not be an RF ground). Additionally, the edge ring is generally formed from a suitable dielectric material such as silicon, silicon oxide, silicon nitride, silicon carbide, quartz and the like. By way of example, an edge ring formed from silicon, and more particularly from single crystal silicon, works well.

The uniformity pedestal 130 also includes an impedance matching layer 158 that is disposed between the edge ring 156 and the electrode 152. The impedance matching layer 158 is preferably configured for controlling the impedance of the electric field produced by the electrode 152 across the surface of the substrate. More particularly, the impedance matching layer 158 is configured for altering the impedance of the electric field produced near the edge of the substrate 160. By altering the impedance, a more uniform coupling of energy is produced across the surface of the substrate. As a result, process uniformity may be obtained such that the process rate at the center of the substrate is substantially equal to the process rate at the edge of the substrate. Accordingly, the edge of the substrate may be used to form IC's thereby increasing the yield. In some cases, the invention allows the last 3 mm of the substrate to be used.

Figure 3:
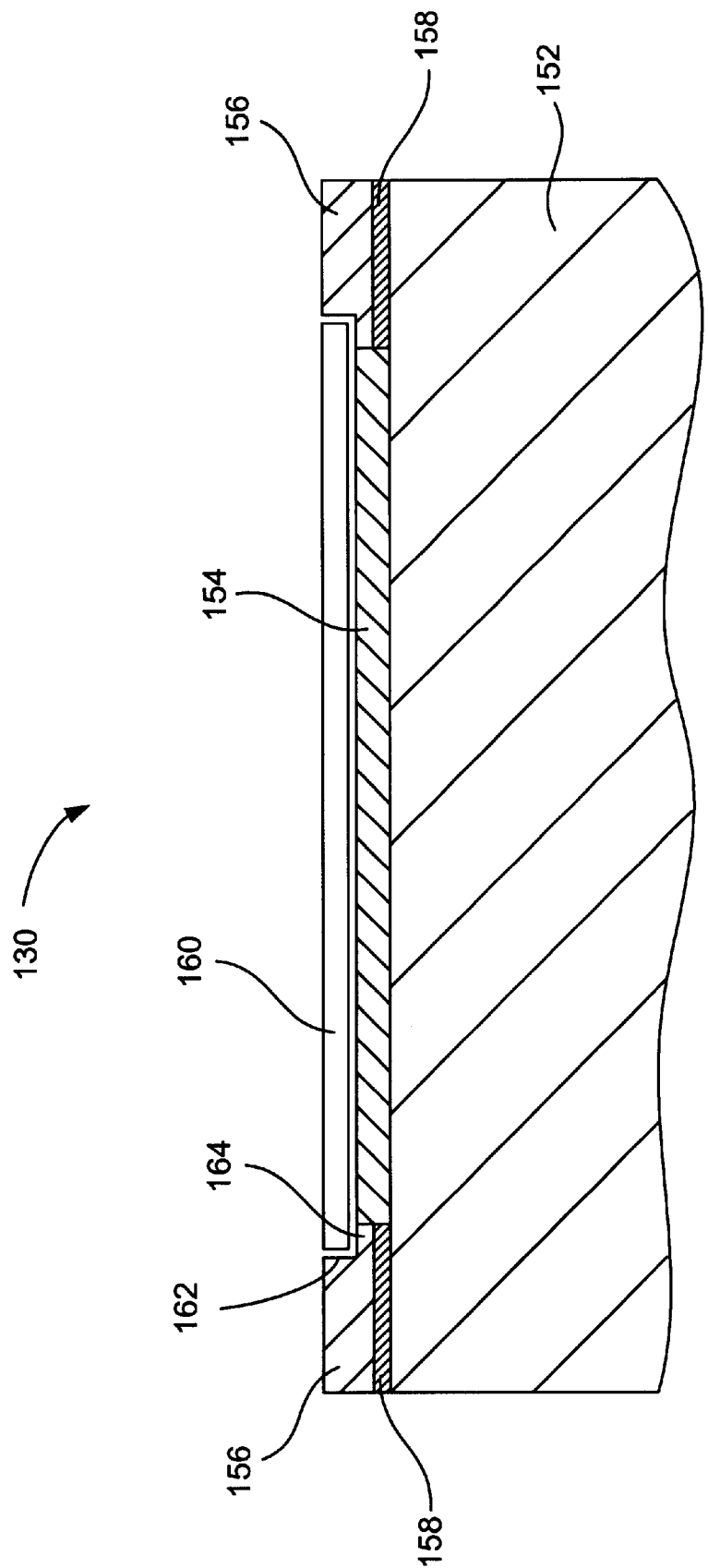
FIG. 3 is a side elevation view, in cross section, of a uniformity pedestal, in accordance with one embodiment of the present invention.

As shown in FIG. 3, the impedance matching layer 158 is sandwiched between the edge ring 156 and the electrode 152. In one embodiment, the impedance matching layer 158 is coupled to the upper surface of the electrode 152. In another embodiment, the impedance matching layer 158 is coupled to the lower surface of the edge ring 156. In either embodiment, the connection between the impedance matching layer 158 and the corresponding surface may be made in any suitable manner. In a preferred embodiment, however, the impedance matching layer is bonded on the corresponding surface (e.g., edge ring or electrode) to produce better thermal and electrical bonds. By way of example, a bonding process such as silicon elastomer works well.

Furthermore, the thickness and type of material used are important factors for effectively controlling the impedance between the electrode and the plasma. In general, the thickness of the impedance matching layer may be between about 0.10 to about 10 mm, and the impedance matching layer may be formed from a suitable material such as a dielectric, semi-conductive or conductive material. By way of example, materials such as silicon, silicon oxides, silicon nitride, silicon carbide, quartz, aluminum, anodized aluminum and aluminum ceramics such as aluminum oxide work well.

The length (or amount of coverage) of the impedance matching layer is also an important factor for effectively controlling the impedance between the electrode and the plasma. In one embodiment, the length of the impedance matching layer is equal to the length of the edge ring (e.g., across the bottom surface of the edge ring). In another embodiment, the length of the impedance matching layer is smaller than the length of the edge ring. In this particular embodiment, the smaller impedance matching layer may be positioned towards the inner periphery of the edge ring, the outer periphery of the edge ring or in the middle of the edge ring. By way of example, the impedance matching layer may be arranged so that it is disposed between the edge ring and the electrode only in the region of the substrate.

The degree to which the coupling of energy can be achieved is typically a factor of the overall impedance per unit area between the plasma and the electrode. As is well known to those skilled in the art, the impedance is generally defined as a measure of the opposition to the flow of charge or current through a circuit. On a substrate having high and low impedance areas across the substrate and for a given power across the substrate, it is generally believed that in a low impedance region of the substrate, the coupled energy tends to be high and in a high impedance region of the substrate, the coupled energy tends to be low. Accordingly, the uniform coupling of energy is highly dependent on the impedance of the uniformity pedestal.

In general, the overall impedance per unit area is a function of the impedance per unit area of the substrate, the impedance per unit area of the chuck, the impedance per unit area of the edge ring, the impedance per unit area of the impedance matching layer, and the impedance per unit area of any gaps or interfaces found therebetween. Unfortunately, however, the impedance produced through the chuck and the substrate at the center of the substrate is typically different than the impedance produced through the chuck, the edge ring and the substrate at the edge of the substrate because of the air gaps and interfaces found between the aforementioned parts at the edge of the substrate, and the material differences of the chuck and the edge ring. As a result, the coupling of energy at the edge of the substrate is generally different than the coupling of energy at the center of the substrate (e.g., non-uniform).

In a preferred embodiment, the impedance matching layer is arranged to adjust the impedance (e.g., sheath voltage) at the edge of the substrate such that the impedance at the edge of the substrate is equal to the impedance at the center of the substrate. In this manner, the coupling of energy across the surface of the substrate is more uniform, and therefore process uniformity can be achieved.

In one implementation, the thickness of the edge ring and the thickness of the impedance matching layer are optimized to achieve the desired coupling effect. For example, a decrease/increase in the edge ring thickness and an increase/decrease in the impedance matching layer thickness may reduce/increase the impedance at the edge of the substrate. In another implementation, the material properties (e.g., dielectric constant) of the impedance matching layer may be adjusted to match the impedance at the edge of the substrate with the impedance at the center of the substrate. For example, a decrease/increase in the value of the dielectric constant may reduce/increase the impedance at the edge of the substrate. In yet another implementation, the length and position of the impedance matching layer may be optimized to achieve the desire coupling effect. For example, a smaller/larger impedance matching layer length may reduce/increase the impedance at the edge of the substrate. Additionally, the position of the impedance matching layer with respect to an edge of the edge ring may also reduce/increase the impedance at the edge of the substrate.

Accordingly, the thickness of the impedance matching layer, as well as, the thickness of the edge ring, the material properties of the impedance matching layer, and the length and the position of the impedance matching layer can be used to match the impedance at the edge of the substrate with the impedance at the center of the substrate.

In one particular embodiment, the thickness of the second portion of the edge ring (e.g., portion that extends underneath the substrate) is about 1 mm and the thickness of the impedance matching layer is about 1 mm. Furthermore, the edge ring has the same dielectric constant as the ceramic layer of the chuck, and the impedance matching layer has a dielectric constant that is larger than the dielectric constant of the edge ring. In this example, the dielectric constant is larger to compensate for the epoxy (e.g., increased impedance) that exists at the edge of the ceramic portion of the chuck. The epoxy is generally used to protect the chuck from a regional field (e.g., arcing).

Although the substrate pedestal has been shown and described as producing a uniform electric field, it will be appreciated that the substrate pedestal may also be configured to produce a non-uniform electric field to compensate for other processing non-uniformities such as a non-uniform plasma density. As mentioned, the amount of the impedance generally effects the amount of coupled energy and the amount of coupled energy generally effects the density and energy of the plasma used to process the substrate. Accordingly, the process uniformity of the overall system may be improved by purposefully designing a substrate pedestal that is capable of creating variations in the electric field produced by the electrode. In one particular embodiment, the impedance matching layer is arranged to alter the impedance of the substrate pedestal so as to provide variations in the electric field across the surface of the substrate.

In addition to the electrical coupling, the thermal contact between the substrate and the chuck, as well as, the thermal contact between the electrode and the edge ring is generally insufficient to dissipate the heat produced during processing. As is well known to those skilled in the art, substrate processing (e.g., bombarding ions) tends to increase the temperature of the substrate and the adjacent surfaces surrounding the substrate. As the temperature increases, localized temperature differences are formed across the surfaces that tend to produce variations in the wafer area pressure and gas flow rates. Consequently, these variations produce localized areas of high and low plasma density, which tend to effect process uniformity (e.g., process rates). Furthermore, the temperature of the substrate may rise to unacceptable levels.

Therefore, in accordance with another embodiment of the present invention, a heat transfer system is provided to control the temperature of the substrate and the edge ring during processing. The heat transfer system is generally configured for distributing a heat transfer medium to the substrate/chuck interface and to the edge ring/electrode interface.

Figure 4:
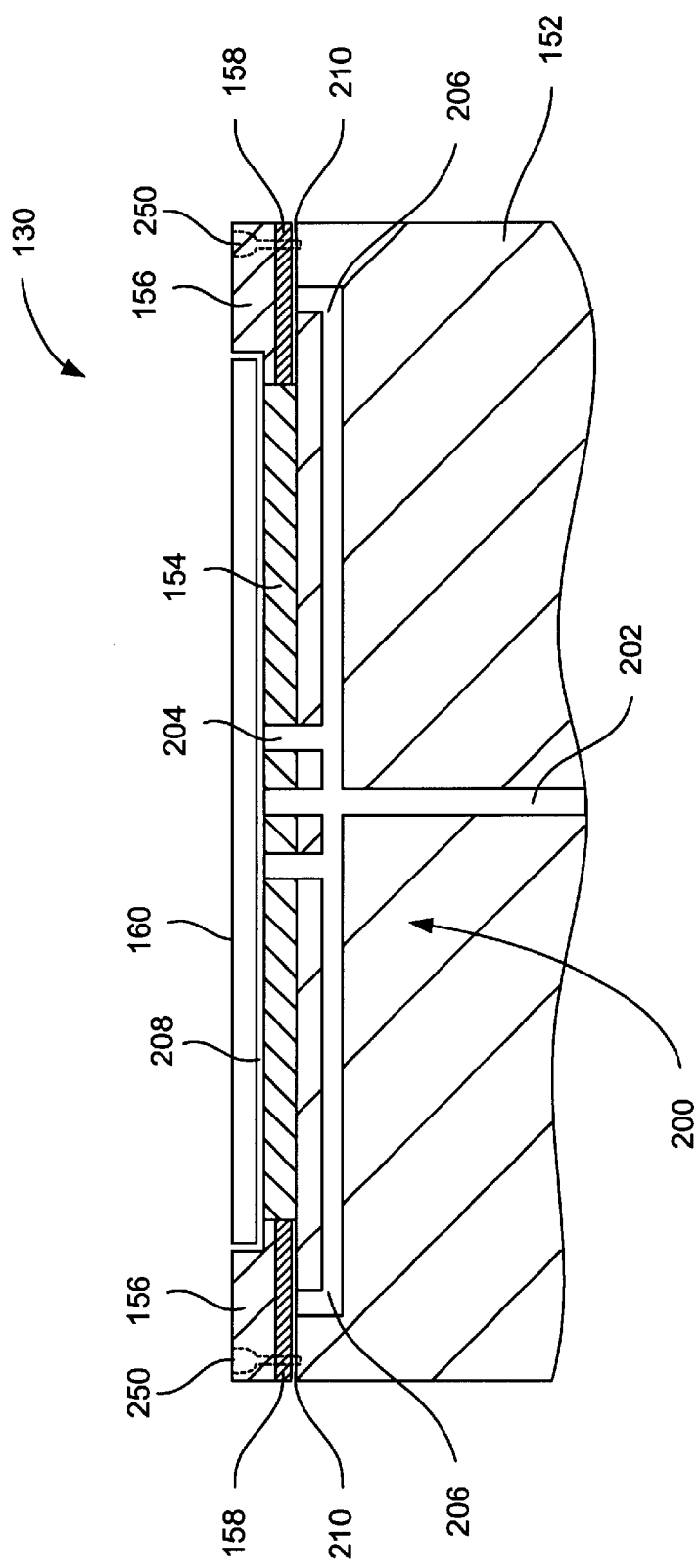
FIG. 4 is a side elevation view, in cross section, of a uniformity pedestal, in accordance with one embodiment of the present invention.

To facilitate discussion of this embodiment, FIG. 4 illustrates a heat transfer system 200 that is disposed inside the uniformity pedestal 130. As described, the uniformity pedestal 130 is configured for supporting a substrate 160 and generally includes an electrode 152, a chuck 154, an edge ring 156 and an impedance matching layer 158. The heat transfer system 200 generally includes a main channel 202 for distributing a heat transfer medium to a plurality of chuck channels 204 and a plurality of edge ring channels 206. The chuck channels 204 are configured for distributing the heat transfer medium to a first gap 208, which is between the chuck 154 and the backside of the substrate 160. The edge ring channels 206 are configured for distributing the heat transfer medium to a second gap 210, which is between the the electrode 152 and the backside of the edge ring 156.

In one embodiment, helium cooling gas is introduced under pressure (e.g., about 20 Torr in one embodiment) into the heat transfer system to act as a heat transfer medium for accurately controlling the substrate and edge ring temperatures during processing to ensure uniform and repeatable processing results. In another embodiment, the edge ring 156 is coupled to the electrode with a bolt 250 to hold the edge ring while providing adequate clearance for the release of the heat transfer medium at the second gap. Additionally or alternatively, heaters may be disposed inside the substrate pedestal to provide even more temperature control.

As can be seen from the foregoing, the present invention offers numerous advantages over the prior art. By way of example, the present invention is capable of processing substrates with a high degree of processing uniformity across the surface of the substrate. In particular, the substrate pedestal provides an impedance matching layer that is capable of controlling the impedance of the substrate pedestal, and therefore the electric field that is coupled therethrough. In one configuration, the impedance matching layer is arranged such that the substrate pedestal produces a uniform electric field inside the process chamber. As a result, the ion density and ion energy used to process the substrate is more uniform, and therefore uniform processing can be achieved. In another configuration, the impedance matching layer is arranged such that the substrate pedestal produces a varying electric field to compensate for other non-uniformities (e.g., non-uniform plasma density). As a result, processing uniformity can be improved upon. Additionally, the invention provides a substrate pedestal that is configured for cooling both the substrate and the edge ring during processing, which as a result reduces temperature, pressure and conductance fluctuations that tend to produce non-uniformities in processing. Accordingly, the present invention reduces edge exclusion and increases substrate yield.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing system for processing a surface of a substrate, comprising;
   a process chamber within which a plasma is both ignited and sustained for said processing, said process chamber having an upper end and a lower end;
   an electrode disposed at said lower end of said process chamber, said electrode being configured for generating an electric field inside said process chamber;
   a chuck disposed above said electrode, said chuck being configured for holding said substrate during said processing;
   an edge ring disposed above said electrode, said edge ring being configured for shielding said electrode and said chuck from said plasma, said edge ring having a first portion configured to be disposed between said electrode and said substrate when said substrate is held by said chuck; and
   an impedance matching layer disposed between said electrode and said edge ring, said impedance matching layer being bonded to said electrode or said edge ring, said impedance matching layer having characteristics or features configured for controlling an impedance between said electrode and said plasma, said impedance being arranged to affect said electric field to improve processing uniformity across the surface of said substrate.

2. The plasma processing system as recited in claim 1 wherein said impedance is configured to reduce variations in said electric field.

3. The plasma processing system as recited in claim 1 wherein said impedance is configured to produce variations in said electric field.

4. The plasma processing system as recited in claim 1 wherein said electric field produces a sheath voltage between the surface of said substrate and said plasma when said substrate is disposed inside said process chamber for processing.

5. The plasma processing system as recited in claim 1 wherein said impedance matching layer is arranged to control said impedance between said electrode and said plasma at the edge of said substrate.

6. The plasma processing apparatus as recited in claim 5 wherein the impedance matching layer is configured to match the impedance between the electrode and the plasma at the edge of said substrate with the impedance between the electrode and the plasma at the center of said substrate.

7. The plasma processing apparatus as recited in claim 1 wherein said impedance matching layer is configured to be disposed between said electrode and said substrate when said substrate is held by said chuck.

8. The plasma processing apparatus as recited in claim 1 wherein said first portion cooperates with said chuck to define an area for receiving a bottom surface of said substrate.

9. The plasma processing apparatus as recited in claim 1 wherein said edge ring has a second portion extending above said first portion, said first portion being configured to surround an outer edge of said chuck, said second portion being configured to surround an outer edge of said substrate when said substrate is held by said chuck for processing whereby said edge ring cooperates with said chuck to form a recessed portion for accepting said substrate for processing.

10. The plasma processing apparatus as recited in claim 1 wherein said chuck has an outer periphery that is smaller than an outer periphery of said substrate.

11. The plasma processing apparatus as recited in claim 1 wherein said impedance matching layer is formed from a dielectric material.

12. The plasma processing apparatus as recited in claim 1 wherein said chuck, edge ring and impedance matching layer are formed from a dielectric material, wherein the dielectric constant of said edge ring is equal to the dielectric constant of said chuck, and wherein the dielectric constant of said impedance matching layer is different than the dielectric constant of said edge ring and said chuck.

13. The plasma processing apparatus as recited in claim 1 wherein a first impedance produced through said chuck is different than a second impedance produced through said edge ring, and wherein said impedance matching layer is arranged to adjust said second impedance produced through said edge ring so that said second impedance is substantially equal to said first impedance produced through said chuck.

14. A plasma processing system for processing a surface of a substrate, comprising:
- a process chamber within which a plasma is both ignited and sustained for processing;
- an electrode disposed inside said process chamber, said electrode being configured for generating an electric field between said plasma and said electrode, said electrode having an inner region and an outer region;
- a chuck disposed above said inner region of said electrode, said chuck being configured for holding said substrate during processing, said chuck affecting a first impedance between said electrode and said plasma in an area above said inner region of said electrode;
- an edge ring disposed above said outer region of said electrode and positioned next to a side of said chuck, said edge ring being configured for shielding at least said electrode from said plasma, said edge ring affecting a second impedance between said electrode and said plasma in an area above said outer region of said electrode;
- an impedance matching layer disposed between said edge ring and said electrode and above said outer region of said electrode, said impedance matching layer having characteristics configured to adjust said second impedance so as to improve processing uniformity across the surface of said substrate.

15. The plasma processing system as recited in claim 14 wherein said chuck is an electrostatic chuck.

16. The plasma processing system as recited in claim 14 wherein said impedance matching layer is bonded to said edge ring.

17. The plasma processing system as recited in claim 14 wherein said impedance matching layer is bonded to said electrode.

18. The plasma processing system as recited in claim 14 wherein the length and position of said impedance matching layer with respect to said edge ring is adjusted to control said second impedance.

19. The plasma processing system as recited in claim 14 wherein the impedance matching layer is formed from a material with a dielectric constant, wherein said dielectric constant is adjusted to control said second impedance.

20. The plasma processing system as recited in claim 14 wherein the thickness of said impedance matching layer is adjusted to control said second impedance.

21. The plasma processing apparatus as recited in claim 20 wherein the thickness of the impedance matching layer is between about 0.10 to about 10 mm.

22. The plasma processing system as recited in claim 14 wherein said electrode has an outer periphery that is greater than or equal to the outer periphery of said substrate when said substrate is disposed on said chuck for processing.

23. The plasma processing system as recited in claim 14 wherein said electric field produces a uniform sheath voltage at the surface of said substrate when said substrate is disposed on said chuck for processing.

24. The plasma processing system as recited in claim 14 further comprising an RF power source that is coupled to said electrode, said RF power source being configured to supply RF energy to said electrode.

25. The plasma processing system as recited in claim 14 further comprising a heat transfer system for controlling the temperature of said substrate and said edge ring during processing, said heat transfer system including a first channel extending through said electrode to the interface between said chuck and said substrate, and a second channel extending through said electrode to the interface between said electrode and said edge ring, said heat transfer system being configured to provide a heat transfer medium through said channels.

26. The plasma processing system as recited in claim 25 wherein said heat transfer medium is a helium gas.

27. The plasma processing apparatus as recited in claim 14 wherein said inner region of said electrode corresponds to an inner portion of said substrate when said substrate is disposed over said chuck for processing, and wherein said outer region of said electrode corresponds to an outer portion of said substrate when said substrate is disposed over said chuck for processing.

28. A plasma processing system for processing a substrate, comprising:
- a process chamber; and
- a uniformity pedestal disposed inside said process chamber, the pedestal being configured for supporting the substrate during processing, the pedestal having a first component disposed below an inner region of the substrate and a second component disposed below an outer region of the substrate, the first component producing a first impedance when energy is coupled therethrough, the second component producing a second impedance when energy is coupled therethrough, the first impedance being different than the second impedance, the pedestal including an impedance matching layer disposed below said second component and having characteristics configured to adjust the second impedance such that the second impedance is substantially equal to the first impedance, said characteristics including at least one of a thickness, a length, a position, or a material property.

* * * * *